United States Patent
Nam et al.

(10) Patent No.: US 9,256,119 B2
(45) Date of Patent: Feb. 9, 2016

(54) PHASE-SHIFT BLANKMASK AND METHOD FOR FABRICATING THE SAME

(71) Applicant: S&S TECH Co., Ltd., Daegu-si (KR)

(72) Inventors: Kee-Soo Nam, Daegu-si (KR);
Geung-Won Kang, Daegu-si (KR);
Dong-Geun Kim, Daegu-si (KR);
Jong-Won Jang, Daegu-si (KR);
Min-Ki Choi, Daegu-si (KR)

(73) Assignee: S & S Tech Co., Ltd, Daegu-si (KR)

( * ) Notice: Subject to any disclaimer, the term of this patent is extended or adjusted under 35 U.S.C. 154(b) by 231 days.

(21) Appl. No.: 13/864,624

(22) Filed: Apr. 17, 2013

(65) Prior Publication Data
US 2013/0288165 A1    Oct. 31, 2013

(30) Foreign Application Priority Data

Apr. 30, 2012  (KR) .......................... 10-2012-0045404
Jan. 25, 2013  (KR) .......................... 10-2013-0008329

(51) Int. Cl.
*G03F 1/26* (2012.01)

(52) U.S. Cl.
CPC ....................................... *G03F 1/26* (2013.01)

(58) Field of Classification Search
CPC ....................................................... G03F 1/26
USPC ..................................................... 430/5, 322
See application file for complete search history.

(56) References Cited

U.S. PATENT DOCUMENTS 6,569,577 B1 * 5/2003 Isao et al. .......................... 430/5

FOREIGN PATENT DOCUMENTS

| JP | 2003005347 A | 1/2003 |
| JP | 2006195202 A | 7/2006 |
| JP | 2008116570 A | 5/2008 |
| TW | 535030 B | 6/2003 |
| TW | 201128294 A | 8/2011 |
| TW | 201207553 A | 2/2012 |

* cited by examiner

*Primary Examiner* — Stephen Rosasco
(74) *Attorney, Agent, or Firm* — William Park & Associates Ltd.

(57) ABSTRACT

Provided is a phase-shift blankmask in which a phase-shift layer is formed in at least two continuous layers or a multi-layer film and an uppermost phase-shift layer included in the phase-shift layer is thinly formed to contain a small amount of oxygen (O) so as to enhance chemical resistance and durability thereof.
Accordingly, a phase-shift blankmask including the phase-shift layer having enhanced chemical resistance and durability with respect to a cleaning solution containing acid and basic materials, hot deionized water, or ozone water, which is used in a cleaning process that is repeatedly performed during manufacture of a photomask, may be provided using the uppermost phase-shift layer having the enhanced chemical resistance and durability.
Furthermore, degradation in the refractive index and degree of phase shift of the phase-shift layer, caused when the cleaning process is repeatedly performed may be prevented due to the uppermost phase-shift layer having the enhanced chemical resistance and durability. Accordingly, a phase-shift blankmask including a thin phase-shift layer can be provided.

14 Claims, 1 Drawing Sheet

PHASE-SHIFT BLANKMASK AND METHOD FOR FABRICATING THE SAME

CROSS-REFERENCE TO RELATED APPLICATION

This application claims priority to and the benefit of Korean Patent Application No. 2012-0045404, filed on Apr. 30, 2012, and No. 2013-0008329, filed on Jan. 25, 2013, the disclosure of which is incorporated herein by reference in its entirety.

BACKGROUND

1. Field of the Invention

The present invention relates to a phase-shift blankmask and a method of fabricating the same, and more particularly, to a phase-shift blankmask including a phase-shift layer having improved chemical resistance and durability to have a thin thickness suitable for a semiconductor manufacturing process using KrF and ArF excimer lasers and a method of fabricating the same.

2. Discussion of Related Art

Today, as a need for a fine circuit pattern has been accompanied by high integration of large-scale integrated circuits (ICs), high semiconductor microfabrication process technology has emerged as a very important issue. In the case of a highly integrated circuit, circuit wires become finer for low power consumption and high-speed operations, and there is a growing technical need for a contact hole pattern for an inter-layer connection and a circuit arrangement for high integration. Thus, in order to satisfy such demands, technology for a photomask on which an original circuit pattern is recorded needs to be manufactured to be finer and to be capable of recording a more precise circuit pattern thereon.

A photolithography technology has been developed to shorten an exposure wavelength by using a 436 nm g-line, a 365 nm i-line, 248 nm KrF laser, or 193 nm ArF laser in order to improve the resolution of a semiconductor circuit pattern. However, the shortening of the exposure wavelength greatly contributes to an improvement in the resolution of a semiconductor circuit pattern but deteriorates a depth of focus (DoF), thereby increasing a burden on design of an optical system including a lens.

Accordingly, in order to solve this problem, a phase-shift mask has been developed to improve both the resolution and DoF of a semiconductor circuit pattern using a phase-shift layer that shifts the phase of exposure light by 180 degrees. A phase-shift blankmask has a structure in which a phase-shift layer, a light-shielding film, and a photoresist film are stacked on a transparent substrate. The phase-shift blankmask can be used as a blankmask for realizing a high-precision minimum critical dimension (CD) of 90 nm or less during a semiconductor photolithography process, and particularly, can be used in the field of lithography using 248 nm KrF laser or 193 nm ArF laser and the field of immersion exposure lithography.

During a process of cleaning a photomask formed as a phase-shift blankmask, a cleaning solution containing an acid material, such as sulfuric acid, and a basic material, such as ammonium, have been used but a cleaning process using hot deionized water and ozone ($O_3$) water has recently been introduced. However, a conventional phase-shift layer, e.g., a phase-shift layer having nitrogen (N)-containing metal silicide, has a certain degree of chemical resistance to acid and basic chemicals but has low durability with respect to hot deionized water and ozone water. Also, a phase-shift layer having nitrogen (N) and oxygen (O)-containing metal silicide has low durability with respect to a cleaning solution containing acid and basic materials. Thus, phase-shift layers become thicker and thicker to compensate for variations in a refractive index and phase shift degree thereof.

As a cleaning process is repeatedly performed during manufacture of a photomask and during use of the photomask, a thickness of a phase-shift layer changes, thus causing a change in the optical characteristics (e.g., a degree of phase shift, transmissivity, reflectivity, etc.) of the photomask. Furthermore, as the cleaning process is repeatedly performed, surfaces of the phase-shift layer are damaged to cause a change in surface roughness and flatness thereof. Accordingly, the durability of the phase-shift layer is degraded, and it is thus difficult to manufacture a reliable photomask.

SUMMARY OF THE INVENTION

The present invention is directed to a phase-shift blankmask including a thin phase-shift layer having improved chemical resistance and durability not to deteriorate (not to dissolve or corrode) due to a cleaning solution containing acid and basic materials, ozone water, and hot deionized water used in a cleaning process that is repeatedly performed a plurality of numbers of time during manufacture of a photomask, and a method of fabricating the same.

According to an aspect of the present invention, there is provided a phase-shift blankmask in which a phase-shift layer is disposed on a transparent substrate, wherein the phase-shift layer includes at least two layers formed of different materials, wherein an uppermost phase-shift layer among the at least two layers includes at least metal, silicon (Si), oxygen (O), and nitrogen (N).

The phase-shift layer including the at least two layers may be formed in continuous films or a multi-layer film.

The uppermost phase-shift layer included in the phase-shift layer may be formed of MoSiON, and may have a composition ratio in which content of molybdenum (Mo) is 1 at % to 30 at %, content of silicon (Si) is 30 at % to 80 at %, content of oxygen (O) is 0.1 at % to 20 at %, and content of nitrogen (N) is 10 at % to 50 at %.

The uppermost phase-shift layer included in the phase-shift layer may have a thickness of 10 to 200.

In the phase-shift layer, a phase-shift layer disposed below the uppermost phase-shift layer may include at least a metal, silicon (Si), and nitrogen (N).

In the phase-shift layer, the phase-shift layer disposed below the uppermost phase-shift layer may be formed of MoSiN, and may have a composition ratio in which content of molybdenum (Mo) is 1 at % to 30 at %, content of silicon (Si) is 30 at % to 80 at %, and content of nitrogen (N) is 10 at % to 50 at %.

In the phase-shift layer, the phase-shift layer disposed below the uppermost phase-shift layer may have a thickness of 300 to 1,000.

In the phase-shift layer, a ratio of a thickness of the uppermost phase-shift layer to a whole thickness of the phase-shift layer may be 1% to 40%.

In the phase-shift layer, a ratio of a thickness of a phase-shift layer below the uppermost phase-shift layer to a thickness of the uppermost phase-shift layer may be 1:5 to 30.

The metal contained in the phase-shift layer may include at least one selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W).

The phase-shift layer may have a transmissivity of 1% to 30% and a degree of phase shift of 170° to 190°.

The phase-shift blankmask may further include a light-shielding film-forming film disposed on or below the phase-shift layer.

The light-shielding film-forming film may include a light-shielding film and an anti-reflective layer, and has a thickness of 200 to 800.

The light-shielding film-forming film may include at least one selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W), or further includes at least one among silicon (Si), oxygen (O), nitrogen (N), and carbon (C).

The light-shielding film-forming film may include a light-shielding film and an anti-reflective film. The light-shielding film and the anti-reflective film may each be formed of a chrominum (Cr) compound among CrO, CrN, CrC, CrON, CrCO, CrCN, and CrCON.

A stacked structure of the light-shielding film-forming film and the phase-shift layer may be formed to have an optical density of 2.5 or more at ArF and KrF exposure wavelengths.

According to another aspect of the present invention, there is provided a method of fabricating a phase-shift blankmask in which a phase-shift layer is disposed on a transparent substrate, wherein the phase-shift layer is formed in at least two layers formed of different materials according to a sputtering method using one target, and an uppermost phase-shift layer included in the phase-shift layer includes at least a metal, silicon (Si), oxygen (O), and nitrogen (N).

The uppermost phase-shift layer may be formed by injecting an oxygen (O)-containing gas at a ratio of 1 vol % to 60 vol % with respect to whole gases.

After the phase-shift layer is formed, a thermal treatment process may be performed at a temperature range of 250 to 400 for ten to sixty minutes.

The target may include metal and silicon (Si), and a ratio between the metal and the silicon (Si) may be 1 at %: 99 at % to 60 at %.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which.

DETAILED DESCRIPTION OF EXEMPLARY EMBODIMENTS

Hereinafter, exemplary embodiments of the present invention will be described more fully with reference to the accompanying drawings.

Figure 1:
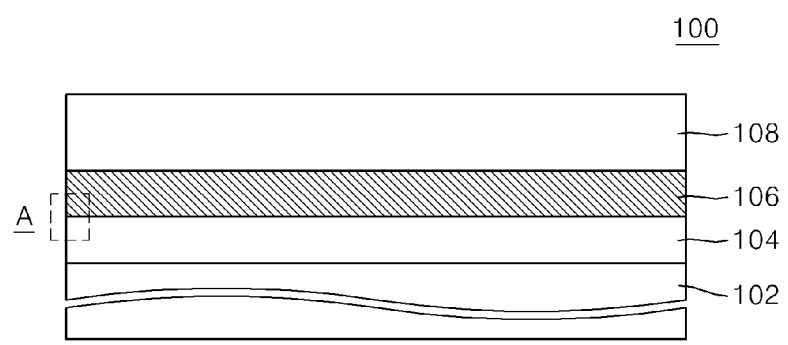
FIG. 1 is a cross-sectional view of a phase-shift blankmask according to an embodiment of the present invention.
Figure 2:
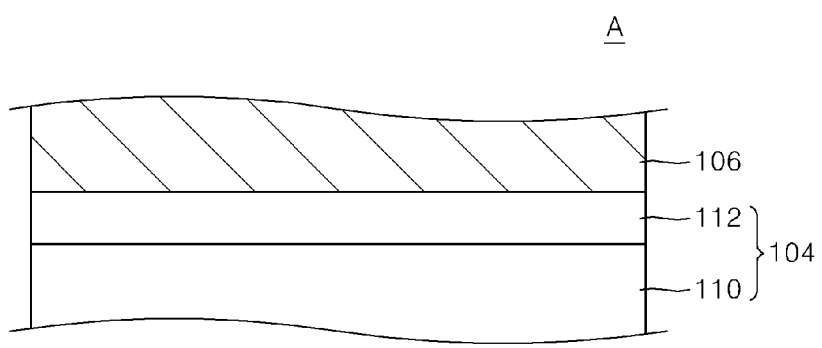
FIG. 2 is an enlarged cross-sectional view of a portion A of FIG. 1.

FIG. 1 is a cross-sectional view of a phase-shift blankmask 100 according to an embodiment of the present invention. FIG. 2 is an enlarged cross-sectional view of a portion A of FIG. 1.

Referring to FIGS. 1 and 2, the phase-shift blankmask 100 according to the present embodiment is a phase-shift blankmask 100 for lithography using ArF laser and KrF laser, in which a phase-shift layer 104, a light-shielding film-forming film 106, and a photoresist film 108 are disposed on a transparent substrate 102.

The transparent substrate 102 has a size of 6 inch×6 inch× 0.25 inch (width×height×thickness), and has a transmissivity of 90% or more at an exposure wavelength of 200 nm or less.

The phase-shift layer 104 may be formed in at least two layers having substantially the same etching characteristics with respect to the same etching material and formed of different materials using one target having the same composition, e.g., a target including a transition metal and silicon (Si). In the target, a ratio between a transition metal and silicon (Si) may be 1 at % to 40 at %:99 at % to 60 at %.

The phase-shift layer 104 may be, for example, a two-layer film including a first phase-shift layer 110 and a second phase-shift layer 112. The first phase-shift layer 110 and the second phase-shift layer 112 that constitute the phase-shift layer 104 may be formed in continuous films or a multi-layer film including at least two layers. When the phase-shift layer 104 is a multi-layer film including at least two layers, an uppermost phase-shift layer and a phase-shift layer below the uppermost layer are formed of different materials. In this case, the phase-shift layer below the uppermost phase-shift layer may be formed in multiple layers that are formed using the same materials by changing a composition ratio thereof or that are formed such that a composition rate of a light element is changed by changing a reactive gas. Also, the uppermost layer may be formed in continuous films. Here, the continuous films mean films formed by changing a reactive gas injected in a plasma state during a sputtering process. The composition of the continuous films changes in a depthwise direction thereof. A multi-layer film means a stacked structure of single films, the compositions of which do not change in a depthwise direction thereof.

The phase-shift layer 104 including the first phase-shift layer 110 and the second phase-shift layer 112 includes a transition metal and silicon (Si), and may further include at least one material among oxygen (O), nitrogen (N), and carbon (C). The transition metal may include, for example, at least one selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W).

The phase-shift layer 104 may be formed using a target including molybdenum (Mo) as a transition metal and silicon (Si). In this case, the first phase-shift layer 110 may be, for example, a nitriding phase-shift layer containing a transition metal, silicon (Si), and nitrogen (N), and be preferably formed of MoSiN which is a nitride film. The second phase-shift layer 112 may be an oxidizing phase-shift layer containing a transition metal, silicon (Si), oxygen (O), and nitrogen (N), and be preferably formed of MoSiON which is an oxynitride film. When the first phase-shift layer 110 is formed of MoSiN, the first phase-shift layer 110 has a composition ratio in which the content of molybdenum (Mo) is 1 at % to 30 at %, the content of silicon (Si) is 30 at % to 80 at %, and nitrogen (N) is 10 at % to 50 at %. When the second phase-shift layer 112 is formed of MoSiON, the second phase-shift layer 112 has a composition ratio in which the content of molybdenum (Mo) is 1 at % to 30 at %, silicon (Si) is 30 at % to 80 at %, oxygen (O) is 0.1 at % to 20 at %, and nitrogen (N)

is 10 at % to 50 at %. In this case, the content of oxygen (O) may be preferably small, e.g., 0.1 at % to 5 at %.

The phase-shift layer 104 may be formed in continuous films or a multi-layer film by changing the rate of a reactive gas, changing the intensity of power to be supplied to the target, or using a sputtering process using a plasma-on/off state. In particular, the second phase-shift layer 112 is formed using a sputtering method in which an oxygen-containing gas, e.g., NO, $O_2$, $NO_2$, $N_2O$, CO, or $CO_2$, is injected at a ratio of 1 vol % to 60 vol % with respect to whole injected gases. Furthermore, the second phase-shift layer 112 may be formed in an oxygen (O) atmosphere according to a thermal treatment method using ion plating, an ion-beam, plasma surface treatment, a rapid thermal process (RTP) apparatus, a vacuum-hot plate baking apparatus, a furnace, or the like.

The second phase-shift layer 112 is formed to prevent the phase-shift layer 104 from dissolving or corroding (that is, a degradation phenomenon) due to a cleaning solution used during a cleaning process included in a photomask manufacturing process. Conventionally, a phase-shift layer 104 is formed in a single-layer film formed of (representatively) MoSiN or MoSiON or in a multi-layer film including at least two layers formed of the same material. However, a phase-shift layer formed of MoSiN has a certain degree of chemical resistance and durability with respect to a cleaning solution containing acid and basic materials or a standard clean-1 (SC-1) solution, but has low chemical resistance and durability with respect to a cleaning process using hot deionized water and ozone water. A phase-shift layer formed of MoSiON has a certain degree of chemical resistance and durability with respect to a cleaning process using hot deionized water and ozone water, but has low chemical resistance and durability with respect to a cleaning solution containing acid and basic materials or the SC-1 solution. Thus, when the phase-shift layer is damaged during the cleaning process using such a cleaning solution, the phase-shift layer may decrease in thickness, increase in transmissivity, and change in a degree of phase shift. Thus, it is difficult to achieve desired optical physical properties of the phase-shift layer.

The phase-shift layer according to an embodiment of the present invention includes the second phase-shift layer 112 formed of MoSiON containing a small content of oxygen (O) on an uppermost portion thereof. Such a film formed of MoSiON containing a small content of oxygen (O) has high chemical resistance and durability with respect to not only a cleaning solution containing acid and basic materials and a cleaning solution such as the SC-1 solution but also hot deionized water and ozone water. Thus, damage to the phase-shift layer 104 caused during the cleaning process may be minimized by forming the first phase-shift layer 110 (formed below the second phase-shift layer 112) as a film formed of MoSiN and forming the second phase-shift layer 112 which is an uppermost layer as a film formed of MoSiON containing a small content of oxygen (O), thereby reducing a whole thickness of the phase-shift layer 104.

After the phase-shift layer 104 is formed, a thermal treatment process may be performed on the phase-shift layer 104 to improve physical properties thereof if needed. The thermal treatment process may be performed at temperature range of 250 to 400 for 10 to 60 minutes.

The first phase-shift layer 110 has a thickness of 300 to 1,000, preferably has a thickness of 500 to 700 when the first phase-shift layer 110 is used as a phase-shift layer for ArF lithography, and preferably has a thickness of 700 to 1,000 when the first phase-shift layer 110 is used as a phase-shift layer for KrF lithography. The second phase-shift layer 112 has a thickness of 10 to 200, and preferably, a thickness of 20 to 100. A ratio of the thickness of the second phase-shift layer 112 is 1% to 40% (preferably, 1% to 15%) to the whole thickness of the phase-shift layer 104. A ratio of the thickness of the first phase-shift layer 110 to the thickness of the second phase-shift layer 112 is preferably 1:5 to 30. When the thickness of the second phase-shift layer 112 exceeds 40% of the whole thickness of the phase-shift layer 104, the thickness of the first phase-shift layer 110 may be reduced to achieve desired thickness and transmissivity. In this case, the refractive index and degree of phase shift of the phase-shift layer 104 may be degraded with respect to an ArF or KrF exposure wavelength. When the first phase-shift layer 110 is formed to a thick thickness so as to compensate for such degradation, it is difficult to form a fine pattern of the phase-shift layer 104, thereby preventing desired optical and physical properties of a phase-shift layer pattern from being achieved.

The phase-shift layer 104 has a transmissivity of 1% to 30%, and preferably, a transmissivity of 6% to 8%. The phase-shift layer 104 has a degree of phase shift of 170° to 190°, and preferably, a degree of phase shift of 180°.

The light-shielding film-forming film 106 may be disposed on or below the phase-shift layer 104. The light-shielding film-forming film 106 is formed of a metal film. The light-shielding film-forming film 106 may be formed of at least one selected from the transition metal group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W), and may further include at least one among silicon (Si), oxygen (O), nitrogen (N), and carbon (C) to the metal material. The light-shielding film-forming film 106 is preferably formed of a material having etch selectivity with respect to the phase-shift layer 104, e.g., a chrome (Cr) compound selected from the group consisting of CrO, CrN, CrC, CrON, CrCO, CrCN, and CrCON.

The light-shielding film-forming film 106 may be formed in a single-layer film or a multi-layer film. For example, the light-shielding film-forming film 106 may further include a layer for controlling the reflectivity and stress of a rear surface of the metal film. If the light-shielding film-forming film 106 has, for example, a two-layer structure, a lower layer and an upper layer of the two-layer structure may be a light-shielding film configured to mainly block exposure light and an anti-reflective layer configured to lower the reflectivity of exposure light, respectively. If the metal film is formed in a multi-layer film, an outermost surface layer preferably has a lower reflectivity at an exposure wavelength than lower layers.

The light-shielding film-forming film 106 has a thickness of 200 to 800, and more preferably, a thickness of 400 to 600. The metal film cannot substantially block exposure light when the thickness thereof is 200 or less, and a resolution and precision for realizing an auxiliary shape pattern are low due to a large thickness of the metal film when the thickness thereof is 800 or more. In a stacked structure of the phase-shift layer 104 and the light-shielding film-forming film 106, an optical density is 2.5 or more and preferably 3.0 to 5 at ArF and KrF exposure wavelengths. The light-shielding film-forming film 106 has a surface reflectivity of 10% to 30% at ArF and KrF exposure wavelengths.

Hereinafter, exemplary embodiments of the present invention will be described in detail with reference to the accompanying drawings. These embodiments are provided so that this disclosure will be thorough and complete and will fully convey the concept of the invention to those skilled in the art.

The exemplary embodiments should be thus considered in descriptive sense only and not for purposes of limitation. It would be appreciated by those of ordinary skill in the art that changes may be made in these exemplary embodiments without departing from the principles and spirit of the invention, the scope of which is defined in the claims and their equivalents.

(Embodiments)
Design of Phase-Shift Layer

The phase-shift layer 104 according to an embodiment of the present invention was formed on the transparent substrate 102, in a two-layer structure including the first phase-shift layer 110 formed of MoSiN and the second phase-shift layer 112 formed of MoSiON.

The phase-shift layer 104 was formed in various forms as shown in Table 1 by using a DC magnetron sputtering equipment including a single target formed of MoSi and injecting nitrogen ($N_2$) gas and NO gas among oxygen (O)-containing gases as reactive gases.

For the phase-shift layer 104, the reactive gases were injected while changing a rate of the $N_2$ gas within a range of 30 vol % to 80 vol % and changing a rate of the NO gas within a range of 0 vol % to 80 vol %. The phase-shift layer 104 was formed to have a whole thickness having a range of 650±20 so that the transmissivity thereof may be approximately 5.8% to 6.2% at a wavelength of 193 nm. In this case, the second phase-shift layer 112 was formed to a thickness of about 50.

Phase-shift layers according to comparative examples presented to compare optical and physical properties thereof with those of the phase-shift layer 104 according to the embodiment of the present invention were each formed in a single layer formed of MoSiN. Similar to the phase-shift layer 104 according to the embodiment of the present invention, the phase-shift layers according to the comparative examples were formed by using a DC magnetron sputtering equipment including a target formed of MoSi and injecting nitrogen ($N_2$) gas as a reactive gas within a range of 30 vol % to 80 vol % of whole gases. The phase-shift layers according to the comparative examples were formed to each have a whole thickness of 650±20 so that transmissivities thereof may be 5.8% to 6.2% at a wavelength of 193 nm.

A variation in a degree of phase shift of each of the phase-shift layers formed according to the embodiment of the present invention and the comparative examples was measured using the MPM-193 tool, and a variation in transmissivity of each of these phase-shift layers was measured using the N&K analyzer.

TABLE 1

<Degrees of phase shift and transmissivities of phase-shift layers>

| Embodiment No. | Target | First-layer film $N_2$ Ratio (vol %) $N_2/(Ar + N_2)$ | Second-layer film NO Ratio (vol %) $NO/(Ar + N_2 + NO)$ | Degree of phase shift (°) @193 nm | Transmissivity (%) @193 nm |
|---|---|---|---|---|---|
| Embodiment 1 | MoSi | 70 | 0 | 179.8 | 5.87 |
| Embodiment 2 | | 70 | 10 | 180.1 | 6.03 |
| Embodiment 3 | | 70 | 30 | 180.3 | 6.04 |
| Embodiment 4 | | 70 | 60 | 179.7 | 6.01 |
| Embodiment 5 | | 75 | 60 | 179.9 | 6.02 |
| Comparative Example 1 | MoSi | 80 | — | 180.2 | 5.81 |
| Comparative Example 2 | | 75 | — | 180.3 | 5.94 |
| Comparative Example 3 | | 70 | — | 179.8 | 6.16 |

In the case of phase-shift layers according to embodiments 2 to 4 in which an uppermost phase-shift-layer was thinly formed using MoSiON among phase-shift layers according to embodiments of the present invention, a degree of phase shift was 180°±0.3° and transmissivity was 6%±0.4% at a wavelength of 193 nm. That is, the phase-shift layers according to embodiments 2 to 4 exhibited desired performances.

Ozone Water Evaluation

An ozone water evaluation was performed on the phase-shift layers formed according to the embodiments of the present invention and the comparative examples. A photomask formed using a blankmask is repeatedly cleansed using ozone water during a manufacture process thereof. During the cleaning process, the chemical resistance of the phase-shift layer is important. The concentration of the ozone water used for the ozone water evaluation was 80 ppm, and the cleaning process was performed on each of the phase-shift layers formed according to the embodiments of the present invention and the comparative examples fifteen times. Then, variations in the degrees of phase shift and transmissivities of the phase-shift layers were measured before and after the cleaning process.

TABLE 2

<A result of measuring variations in degrees of phase shift and transmissivities measured before and after cleaning process using ozone water>

| | | @ 193 nm | | |
|---|---|---|---|---|
| Embodiment No. | | Before cleaning process | After Cleaning process was performed fifteen times | delta |
| Embodiment 1 | Transmissivity (%) | 5.87 | 5.97 | 0.10 |
| | Phase (°) | 179.8 | 178.8 | 1.0 |
| Embodiment 2 | Transmissivity (%) | 6.03 | 6.10 | 0.07 |
| | Phase (°) | 180.1 | 179.3 | 0.8 |

TABLE 2-continued

<A result of measuring variations in degrees of phase shift and transmissivities measured before and after cleaning process using ozone water>

| | | @ 193 nm | | |
|---|---|---|---|---|
| Embodiment No. | | Before cleaning process | After Cleaning process was performed fifteen times | delta |
| Embodiment 3 | Transmissivity (%) | 6.04 | 6.07 | 0.03 |
| | Phase (°) | 180.3 | 180.1 | 0.2 |
| Embodiment 4 | Transmissivity (%) | 6.01 | 6.06 | 0.05 |
| | Phase (°) | 179.7 | 179.1 | 0.6 |
| Embodiment 5 | Transmissivity (%) | 6.02 | 6.08 | 0.06 |
| | Phase (°) | 179.9 | 179.4 | 0.5 |
| Comparative Example 1 | Transmissivity (%) | 5.81 | 6.30 | 0.49 |
| | Phase (°) | 180.2 | 172.0 | 7.2 |
| Comparative Example 2 | Transmissivity (%) | 5.94 | 6.31 | 0.37 |
| | Phase (°) | 180.3 | 174.7 | 5.6 |
| Comparative Example 3 | Transmissivity (%) | 6.16 | 6.41 | 0.25 |
| | Phase (°) | 179.8 | 175.6 | 4.2 |

After the cleaning process using the ozone water was performed on the phase-shift layers (according to embodiments 2 to 4 in which an uppermost phase-shift layer was thinly formed of MoSiON among the phase-shift layers the embodiments of the present invention) fifteen times, variations in the degrees of phase shift were 0.2° to 0.8° and variations in transmissivities were 0.03% to 0.07%, at a wavelength of 193 nm.

In contrast, after the cleaning process using the ozone water was performed on the phase-shift layers (which were each a single film formed of MoSiN according to the comparative examples) fifteen times, variations in the degrees of phase shift were 1.0° to 7.2° and variations in transmissivities were 0.1% to 0.49% at a wavelength of 193 nm. This is understood as results when the phase-shift layers formed of MoSiN were dissolved in the ozone or deteriorated due to the ozone water used during the cleaning process.

Thus, as the second phase-shift layer 112 which is an uppermost layer of the phase-shift layer 104 was thinly formed of MoSiON as in the embodiments of the present invention, a variation in the degree of phase shift was 4° or less and a variation in transmissivity was 0.2% or less. Accordingly, it means that the phase-shift layer 104 according to the embodiment of the present invention has high chemical resistance and durability with respect to ozone water.

SPM Evaluation (SPM: $H_2SO_4+H_2O_2$)

An SPM evaluation was performed on phase-shift layers formed according to embodiments of the present invention and comparative examples. The SPM evaluation is a cleaning process performed to remove a resist layer during manufacture of a photomask formed using a blankmask. The chemical resistances of the phase-shift layers are particularly important during the cleaning process. In the SPM evaluation, a mixed solution of $H_2SO_4$ and $H_2O_2$ was used (volume ratio: $H_2SO_4$:$H_2O_2$=10:1) (hereinafter referred to as SPM solution), a cleaning process was performed three times at a temperature of about 90 for ten minutes, and variations in the degree of phase shift and transmissivity were measured before and after the cleaning process.

TABLE 3

<A result of measuring degrees of phase shift and transmissivities according to a number of times that a cleaning process using the SPM solution was performed>

| | | @ 193 nm | | |
|---|---|---|---|---|
| Embodiment No. | | Before cleaning process | After cleaning process was performed three times | Delta |
| Embodiment 1 | Transmissivity (%) | 5.87 | 5.96 | 0.09 |
| | Phase (°) | 179.8 | 178.7 | 1.1 |
| Embodiment 2 | Transmissivity (%) | 6.03 | 6.08 | 0.05 |
| | Phase (°) | 180.1 | 179.5 | 0.6 |
| Embodiment 3 | Transmissivity (%) | 6.04 | 6.06 | 0.02 |
| | Phase (°) | 180.3 | 180.2 | 0.1 |
| Embodiment 4 | Transmissivity (%) | 6.01 | 6.05 | 0.04 |
| | Phase (°) | 179.7 | 179.3 | 0.4 |
| Embodiment 5 | Transmissivity (%) | 6.02 | 6.06 | 0.04 |
| | Phase (°) | 179.9 | 179.5 | 0.4 |
| Comparative Example 1 | Transmissivity (%) | 5.81 | 6.27 | 0.46 |
| | Phase (°) | 180.2 | 172.3 | 6.9 |
| Comparative Example 2 | Transmissivity (%) | 5.94 | 6.29 | 0.35 |
| | Phase (°) | 180.3 | 174.2 | 5.2 |
| Comparative Example 3 | Transmissivity (%) | 6.16 | 6.40 | 0.24 |
| | Phase (°) | 179.8 | 175.9 | 3.9 |

After a cleaning process using the SPM solution was performed on the phase-shift layers (according to embodiments 2 to 4 in which an uppermost phase-shift-layer was thinly formed using MoSiON among the phase-shift layers according to the embodiments of the present invention) three times, a variation in the degree of phase shift was 0.1° to 0.6° and a variation in transmissivity was 0.02% to 0.05%, at a wavelength of 193 nm.

In contrast, after the cleaning process using the SPM solution was performed on the phase-shift layers (which were each a single film formed of MoSiN according to the comparative examples) three times, a variation in the degree of phase shift was 1.1° to 6.9° and a variation in transmissivity was 0.09% to 0.46%, at a wavelength of 193 nm.

Thus, in the case of the phase-shift layer 104 according to an embodiment of the present invention in which the second phase-shift layer 112 was thinly formed using MoSiON as an uppermost layer of a phase-shift layer as in the embodiments of the present invention, a variation in the degree of phase shift was 4° or less and a variation in transmissivity was 0.2 at % or less. Thus, the phase-shift layer 104 according to the embodiment of the present invention has high chemical resistance and durability with respect to the SPM solution.

SC-1 Evaluation (SC-1: $NH_4OH$:$H_2O_2$:$H_2O$)

The SC-1 evaluation was performed on phase-shift layers formed according to embodiments of the present invention and comparative examples. The SC-1 evaluation was performed to evaluate the chemical resistance of a MoSi-based compound with respect to ammonium water used during a cleaning process during manufacture of a photomask formed using a blankmask. In the SC-1 evaluation, a mixed solution of $NH_4OH$, $H_2O_2$, and $H_2O$ (volume ratio: $NH_4OH$:$H_2O_2$:$H_2O$=1:1:3) was used. The SC-1 evaluation was performed under harsh conditions, at a room temperature of about 23 for two hours. Then, variations in degrees of phase shift and transmissivities were measured before and after the cleaning process.

TABLE 4

<A result of measuring degrees of phase shift and transmissivities when a cleaning process using the SC-1 solution was performed>

| | | @ 193 nm | | |
|---|---|---|---|---|
| Embodiment No. | | Before cleaning process | After cleaning process | delta |
| Embodiment 1 | Transmissivity (%) | 5.87 | 6.18 | 0.31 |
| | Phase (°) | 179.8 | 178.7 | 1.1 |
| Embodiment 2 | Transmissivity (%) | 6.03 | 6.20 | 0.17 |
| | Phase (°) | 180.1 | 178.6 | 1.5 |
| Embodiment 3 | Transmissivity (%) | 6.04 | 6.17 | 0.13 |
| | Phase (°) | 180.3 | 179.1 | 1.2 |
| Embodiment 4 | Transmissivity (%) | 6.01 | 6.22 | 0.21 |
| | Phase (°) | 179.7 | 177.9 | 1.8 |
| Embodiment 5 | Transmissivity (%) | 6.02 | 6.24 | 0.22 |
| | Phase (°) | 179.9 | 178.1 | 1.8 |
| Comparative Example 1 | Transmissivity (%) | 5.81 | 7.67 | 1.86 |
| | Phase (°) | 180.2 | 151.8 | 28.4 |
| Comparative Example 2 | Transmissivity (%) | 5.94 | 7.21 | 1.27 |
| | Phase (°) | 180.3 | 161.6 | 18.7 |
| Comparative Example 3 | Transmissivity (%) | 6.16 | 7.18 | 1.02 |
| | Phase (°) | 179.8 | 164.5 | 15.3 |

After the cleaning process using the SC-1 solution was performed on the phase-shift layers according to embodiments 2 to 4 in which an uppermost phase-shift layer was thinly formed of MoSiON among the phase-shift layers according to the embodiments of the present invention, variations in the degrees of phase shift were 1.2° to 1.8° and variations in transmissivities were 0.13% to 0.22%, at a wavelength of 193 nm.

In contrast, after the cleaning process using the SC-1 solution was performed on the phase-shift layers which were each a single film formed of MoSiN according to the comparative examples, variations in the degrees of phase shift were 1.1° to 28.4° and variations in transmissivities were 0.31% to 1.86% at a wavelength of 193 nm.

Thus, as an uppermost layer of the phase-shift layer 104 was thinly formed of MoSiON as an uppermost layer of a phase-shift layer as in the embodiments of the present invention, a variation in the degree of phase shift was 4° or less and a variation in transmissivity was 0.2% or less. Accordingly, it means that the phase-shift layer 104 according to the embodiment of the present invention has high chemical resistance and durability with respect to the SC-1 solution.

HOT-DIW Evaluation

An evaluation of a cleaning process using hot deionized water (HOT-DIW) (hereinafter referred to as HOT-DIW evaluation) was performed on phase-shift layers formed according to embodiments of the present invention and comparative examples. The HOT-DIW evaluation was performed under condition in which the phase-shift layers were immersed in deionized water (DIW) of 95 for fifty minutes, and variations in degrees of phase shift and transmissivities were measured before and after the cleaning process.

TABLE 5

<A result of measuring variations in degrees of phase shift and transmissivities according to the HOT-DIW evaluation>

| | | @ 193 nm | | |
|---|---|---|---|---|
| Embodiment No. | | Before cleaning process | After cleaning process | delta |
| Embodiment 1 | Transmissivity (%) | 5.87 | 6.47 | 0.60 |
| | Phase (°) | 179.8 | 175.7 | 4.1 |
| Embodiment 2 | Transmissivity (%) | 6.03 | 6.27 | 0.24 |
| | Phase (°) | 180.1 | 177.8 | 2.3 |
| Embodiment 3 | Transmissivity (%) | 6.04 | 6.23 | 0.19 |
| | Phase (°) | 180.3 | 178.5 | 1.8 |
| Embodiment 4 | Transmissivity (%) | 6.01 | 6.28 | 0.27 |
| | Phase (°) | 179.7 | 177.1 | 2.6 |
| Embodiment 5 | Transmissivity (%) | 6.02 | 6.30 | 0.28 |
| | Phase (°) | 179.9 | 177.2 | 2.7 |
| Comparative Example 1 | Transmissivity (%) | 5.81 | 7.98 | 2.17 |
| | Phase (°) | 180.2 | 148.8 | 31.4 |
| Comparative Example 2 | Transmissivity (%) | 5.94 | 7.78 | 1.84 |
| | Phase (°) | 180.3 | 154.2 | 26.1 |
| Comparative Example 3 | Transmissivity (%) | 6.16 | 7.68 | 1.52 |
| | Phase (°) | 179.8 | 159.4 | 20.4 |

After the cleaning process using the HOT-DOW was performed on a phase-shift layer in which an uppermost phase-shift layer was thinly formed of MoSiON among the phase-shift layers according to the embodiments of the present invention, a variation in the degree of phase shift was 1.8° to 2.7° and a variation in transmissivity was 0.19% to 0.28%, at a wavelength of 193 nm.

In contrast, after the cleaning process using the HOT-DIW was performed on the phase-shift layers that were each a single film formed of MoSiN according to the comparative examples, a variation in the degree of phase shift was 4.1° to 31.4° and a variation in transmissivity was 0.6% to 2.17%, at a wavelength of 193 nm.

Thus, as an uppermost layer of the phase-shift layer 104 was thinly formed of MoSiON as an uppermost layer of a phase-shift layer as in the embodiments of the present invention, a variation in the degree of phase shift was 4° or less and a variation in transmissivity was 0.2% or less. Accordingly, it means that the phase-shift layer 104 according to the embodiment of the present invention has high chemical resistance and durability with respect to the HOT-DIW.

As shown in Tables 2 to 4, it means that the phase shift layers having a two-layer structure according to the embodiments of the present invention, e.g., the phase-shift layer 104 including the second phase-shift layer 112 which is an oxidizing uppermost layer formed of MoSiON to a thickness of about 50, had higher chemical resistance and durability than the phase-shift layers which were each a nitriding single film formed of MoSiN according to the comparative examples.

Also, it was noted that the phase-shift layer formed when a ratio of NO gas to whole injected gases was about 30 vol % among gases used to form uppermost phase-shift layers had highest physical properties than the other phase-shift layers according to the embodiments of the present invention.

As described above, according to an embodiment of the present invention, a phase-shift layer is formed in at least two continuous films or a multi-layer film, and an uppermost phase-shift layer included in the phase-shift layer is formed to a thin thickness and contains a small amount of oxygen (O) to have enhanced chemical resistance and durability thereof.

Thus, a phase-shift blankmask including a phase-shift layer having enhanced chemical resistance and durability with respect to a cleaning solution containing acid and basic materials, hot deionized water, or ozone water, which is used in a cleaning process that is repeatedly performed during manufacture of a photomask, may be provided using the uppermost phase-shift layer having the enhanced chemical resistance and durability.

Furthermore, degradation in the refractive index and degree of phase shift of the phase-shift layer, caused when the cleaning process is repeatedly performed may be prevented due to the uppermost phase-shift layer having the enhanced chemical resistance and durability. Accordingly, a phase-shift blankmask including a thin phase-shift layer can be provided.

It will be apparent to those skilled in the art that various modifications can be made to the above-described exemplary embodiments of the present invention without departing from the spirit or scope of the invention. Thus, it is intended that the present invention covers all such modifications provided they come within the scope of the appended claims and their equivalents.

What is claimed is:

1. A phase-shift blankmask in which a phase-shift layer is disposed on a transparent substrate, wherein the phase-shift layer comprises at least two layers formed of different materials,
    wherein an uppermost phase-shift layer among the at least two layers comprises at least a metal, silicon (Si), oxygen (O), and nitrogen (N),
    wherein, in the phase-shift layer, a phase-shift layer disposed below the uppermost phase-shift layer comprises at least a metal, silicon (Si) and nitrogen (N), while not comprising oxygen (O),
    wherein the uppermost phase-shift layer included in the phase-shift layer has a thickness of 10 Å to 200 Å.

2. The phase-shift blankmask of claim 1, wherein the phase-shift layer including the at least two layers is formed in continuous films or a multi-layer film.

3. The phase-shift blankmask of claim 1, wherein the uppermost phase-shift layer included in the phase-shift layer is formed of MoSiON, and has a composition ratio in which content of molybdenum (Mo) is 1 at % to 30 at %, content of silicon (Si) is 30 at % to 80 at %, content of oxygen (O) is 0.1 at % to 20 at %, and content of nitrogen (N) is 10 at % to 50 at %.

4. The phase-shift blankmask of claim 1, wherein, in the phase-shift layer, the phase-shift layer disposed below the uppermost phase-shift layer is formed of MoSiN, and has a composition ratio in which content of molybdenum (Mo) is 1 at % to 30 at %, content of silicon (Si) is 30 at % to 80 at %, and content of nitrogen (N) is 10 at % to 50 at %.

5. The phase-shift blankmask of claim 1, wherein, in the phase-shift layer, the phase-shift layer disposed below the uppermost phase-shift layer has a thickness of 300 Å to 1,000 Å.

6. The phase-shift blankmask of claim 1, wherein, in the phase-shift layer, a ratio of a thickness of the uppermost phase-shift layer to a whole thickness of the phase-shift layer is 1% to 40%.

7. The phase-shift blankmask of claim 1, wherein, in the phase-shift layer, a ratio of a thickness of a phase-shift layer below the uppermost phase-shift layer to a thickness of the uppermost phase-shift layer is 1 : 5 to 30.

8. The phase-shift blankmask of claim 1, wherein the metal contained in the phase-shift layer comprises at least one selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W).

9. The phase-shift blankmask of claim 1, wherein the phase-shift layer has a transmissivity of 1% to 30% and a degree of phase shift of 170° to 190°.

10. The phase-shift blankmask of claim 1, further comprising a light-shielding film-forming film disposed on or below the phase-shift layer.

11. The phase-shift blankmask of claim 10, wherein the light-shielding film-forming film comprises a light-shielding film and an anti-reflective layer, and has a thickness of 200 Å to 800 Å.

12. The phase-shift blankmask of claim 10, wherein the light-shielding film-forming film comprises at least one selected from the group consisting of titanium (Ti), vanadium (V), cobalt (Co), nickel (Ni), zirconium (Zr), niobium (Nb), palladium (Pd), zinc (Zn), chromium (Cr), aluminum (Al), manganese (Mn), cadmium (Cd), magnesium (Mg), lithium (Li), selenium (Se), copper (Cu), molybdenum (Mo), hafnium (Hf), tantalum (Ta), and tungsten (W), or further comprises at least one among silicon (Si), oxygen (O), nitrogen (N), and carbon (C) to the metal.

13. The phase-shift blankmask of claim 10, wherein the light-shielding film-forming film comprises a light-shielding film and an anti-reflective film,
    wherein the light-shielding film and the anti-reflective film are each formed of a chromium (Cr) compound among CrO, CrN, CrC, CrON, CrCO, CrCN, and CrCON.

14. The phase-shift blankmask of claim 10, wherein a stacked structure of the light-shielding film-forming film and the phase-shift layer is formed,
    wherein the stacked structure has an optical density of 2.5 or more at ArF and KrF exposure wavelengths.

* * * * *